United States Patent [19]

Burgess et al.

[11] Patent Number: 5,142,183

[45] Date of Patent: Aug. 25, 1992

[54] ELECTRONIC SWITCH ASSEMBLY

[75] Inventors: James P. Burgess, Bloomfield Hills, Mich.; Thomas Walker, Ojai, Calif.

[73] Assignee: Touch Tec International, Mt. Clemens, Mich.

[21] Appl. No.: 750,110

[22] Filed: Aug. 26, 1991

[51] Int. Cl.$^5$ ............................................. H01L 41/08
[52] U.S. Cl. ................................... 310/339; 310/324; 310/328; 310/338; 200/181; 29/25.35
[58] Field of Search ..................... 29/25, 35; 200/181; 341/34

[56] References Cited

U.S. PATENT DOCUMENTS

| | | | |
|---|---|---|---|
| 3,031,591 | 4/1962 | Cary et al. | 310/338 |
| 3,239,696 | 3/1966 | Burkhalter et al. | 310/345 X |
| 3,935,484 | 1/1976 | Lescheh et al. | 310/338 |
| 4,578,611 | 3/1986 | Sadler | 310/338 |
| 4,703,652 | 11/1987 | Itoh et al. | 310/324 X |
| 4,820,953 | 4/1989 | Saubolle et al. | 310/338 |

Primary Examiner—Mark O. Budd
Attorney, Agent, or Firm—Krass & Young

[57] ABSTRACT

A piezoelectric switch assembly and method of manufacture. A piezoelectric module is provided which is comprised of a carrier disk and a wafer of piezoelectric material disposed thereon, with electrical leads connected thereto. The piezoelectric module is disposed inside a hollow recess formed in a switch plug, with the periphery of the carrier disk supported on a rim thereof. A disk of compressible material is disposed between the body of the plug and the piezoelectric module. The switch plug is inserted into a hollow chamber formed in a switch insert, said switch insert having a pressure receiving front wall. A front member is provided which is formed with an aperture for receiving the switch insert. Pressure on the pressure receiving front wall of the socket causes deformation of the piezoelectric wafer to generate an electrical signal which is received by circuitry attached to the electrical leads to effect one or more preselected switch functions.

15 Claims, 8 Drawing Sheets

ELECTRONIC SWITCH ASSEMBLY

BACKGROUND OF THE INVENTION

1. Field of the Invention

This invention relates generally to elect switches having no moving contacts, and more specifically, to such electronic switches utilizing a switching signal generated by deformation of a piezoelectric material.

2. Description of the Prior Art

Contactless piezoelectric switches are known in the prior art. Typically, such switches employ a deformable face or surface, and a thin body of piezoelectric material arranged such that a deforming force is transmitted from the face or surface to the piezoelectric material, thus causing the material to generate an electrical signal. Electrodes are employed in conjunction with the body of piezoelectric material so that the electrical signal may be communicated to, for example, switch circuitry. Thus, when the deformable face is pressed by the user, the piezoelectric material generates an electrical signal and activates the switching circuit. Such switches are disclosed in, for example, U.S. Pat. Nos. 3,339,104 and 4,618,797.

Such contactless switches have inherent advantages over conventional switches with moving parts in that they can be made vandal-proof and are much less sensitive to environmental degradation. They have no moving parts or electrical contacts to wear out, and produce no electrical arc or electromagnetic interference, a great benefit in explosive or sensitive electronic environments.

However, the piezoelectric contactless switches of the prior art suffer from certain disadvantages. They are designed to accommodate piezoelectric bodies, which are typically bonded to a support member, and which must be fit to close tolerances, thus necessitating expensive shaping operations which can damage this delicate material. Furthermore, since the piezoelectric chips used in the prior art switches must be custom fitted, the devices cannot employ relatively inexpensive piezoelectric disks which are available in standard sizes and configurations.

It would be desirable to provide a contactless, piezoelectric switch assembly which is easy to assemble, inexpensive to manufacture and which employs standard components. It would further be advantageous to provide such a switch which is both durable and reliable.

SUMMARY OF THE INVENTION

Disclosed and claimed herein is a contactless, piezoelectric switch assembly and method of manufacture thereof. The piezoelectric switch assembly employs a piezoelectric module including a carrier disk formed of a resilient, electrically conductive material such as brass. A piezoelectric wafer is mounted thereon. First and second electrodes are mounted on, respectively, the piezoelectric wafer and the carrier disk. First and second electrical leads are then connected to, respectively, the first and second electrodes. The first and second electrodes may comprise solder or similar material used to affix the first and second leads to the wafer and the carrier disk.

The piezoelectric module described above is disposed between a cup-shaped insert and a cylindrical plug configured to be received therein. The cup-shaped insert has a pressure receiving front wall and a cylindrical cavity opening onto a rear surface thereof. The cylindrical plug includes an annular rim formed on a front face thereof to define a hollow recess to receive the piezoelectric module such that the rim of the carrier disk thereof is supported by the rim. The cylindrical plug also includes an axially extending channel formed on the perimeter thereof to receive the first and second leads extending from the piezoelectric module. The switch assembly further comprises a front member which is mountable on a housing and has formed therein a circular aperture having a peripheral edge. The circular aperture of the front member and the pressure receiving front wall of the cup-shaped insert are configured such that the insert may be inserted into the aperture such that an exterior surface of the front wall thereof is approximately flush with the edge of the aperture. A disk of resilient material such as polymeric foam is inserted into the hollow recess of the cylindrical plug to hold the piezoelectric module in the correct position with respect to the other elements of the assembly.

The switch assembly may further comprise an electronic circuit in electrical communication with the first and second electrical leads and operative to perform a predetermined switch function upon receipt of an electrical signal generated by the piezoelectric disk. The electronic circuit may be configured to perform a variety of switching functions, such as toggle on and off, dimmer setting, momentary, etc., or may combine one or more of these and/or other switch functions. A housing having a front panel, a back and side walls may be provided to enclose the switch components.

The cup-shaped insert may further comprise a thin layer of polymeric sheet material, such as white polystyrene, upon which selected indicia may be printed. If the switch insert is formed of a transparent material such as clear polycarbonate, the indicia, which overlay the piezoelectric module, will be clearly visible to the observer. The clear polycarbonate material is resilient enough that a slight press of the operator's finger on the pressure receiving front wall will transmit mechanical deforming forces to the piezoelectric module and wafer of piezoelectric material, thereby generating an electrical signal and activating the associated switch circuitry.

In a particular preferred embodiment, the aperture in the front member is defined by an annular side wall projecting from a front surface of the front member, the side wall including an annular lip which tapers inwardly from the front surface. The socket is configured to include a projecting, peripheral side wall having the pressure receiving front wall disposed thereon, the junction between the peripheral side wall and the front wall forming a tapering surface corresponding to the tapering annular lip disposed on the aperture. In this manner, when the socket is inserted into the aperture of the front member, the pressure receiving front wall will positively seat flush with the front surface of the front member.

In another particularly preferred embodiment, the socket further comprises an annular groove formed on a rear edge of the cylindrical cavity. The plug further comprises a mating annular ring formed on a rear face thereof. When the plug is inserted into the cylindrical cavity of the socket, the annular ring seats positively in the annular groove, thereby correctly positioning the socket inside the plug.

BRIEF DESCRIPTION OF THE DRAWINGS

The following detailed description may best be understood by reference to the following drawings in which.

DETAILED DESCRIPTION OF THE PREFERRED EMBODIMENTS

Throughout the following detailed description, like reference numerals are used to refer to the same element of the device shown in multiple figures thereof.

Figure 1:
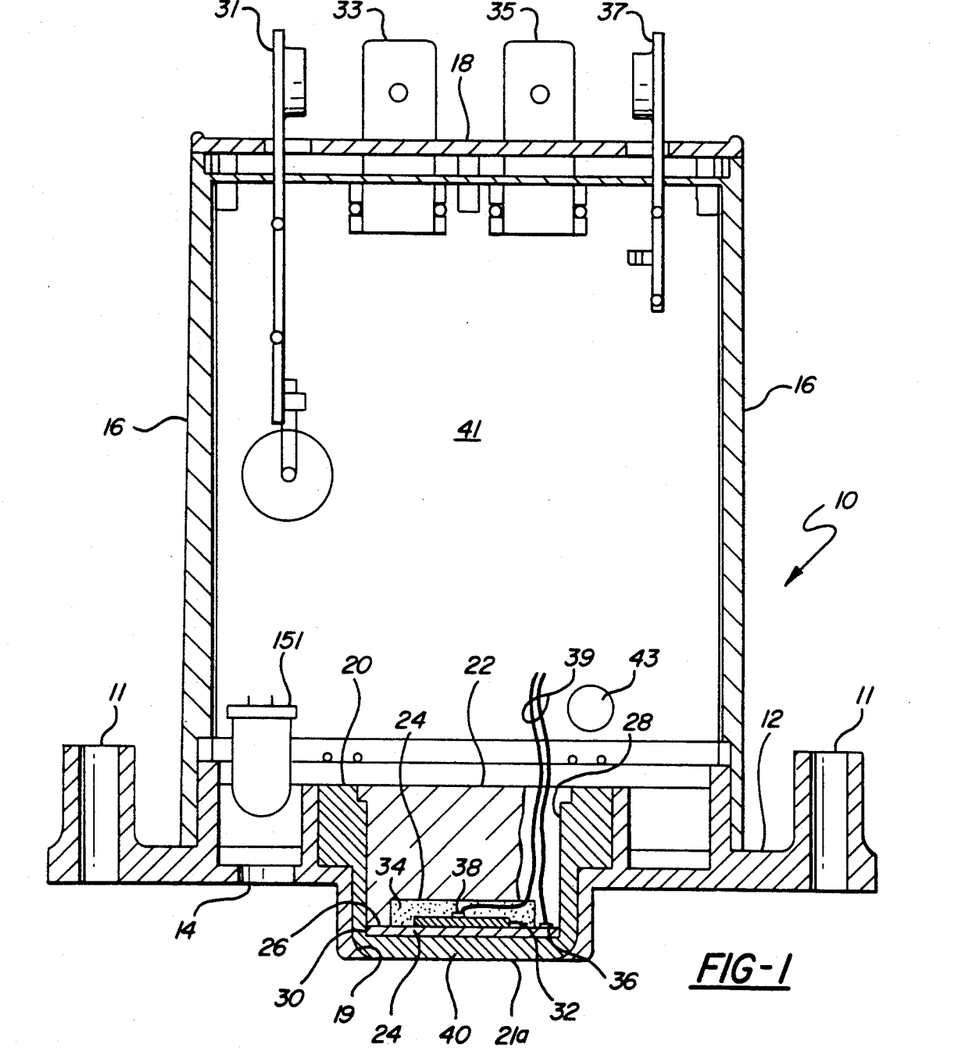
FIG. 1 is a side sectional view of a switch assembly constructed in accordance with the principles of the present invention.
Figure 2:
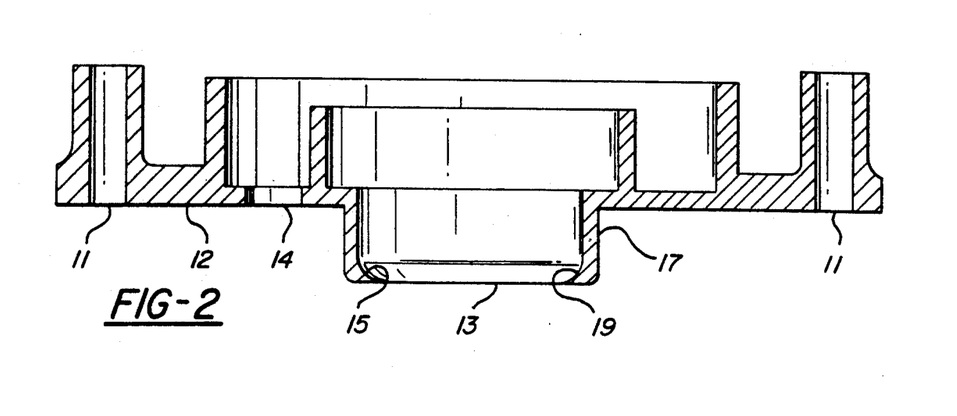
FIG. 2 is a side sectional view of the front member of the switch assembly shown in FIG. 1.

Referring now to the drawings and in particular to FIG. 1, there is depicted a piezoelectric switch assembly 10 constructed according to the principles of the present invention. The switch assembly 10 is housed inside a housing including side walls 16 and back plate 18. Front member 12, best seen in FIG. 2, is deposed on the front of the housing and includes a circular aperture 13 which defines a peripheral edge 15. In a preferred embodiment, aperture 13 and peripheral edge 15 are defined by, respectively, peripheral side wall 17 which projects from a front surface of front member 12, and an annular lip 19 which tapers inwardly from the front surface. Front member 12 is attachable to a control panel (not illustrated) incorporating switch assembly 10 via bolt holes 11.

A cup-shaped insert 20 having a pressure receiving front wall 21 formed thereon is configured to be received in the aperture 13 such that an exterior surface 21a of the wall 21 is approximately flush with the peripheral edge 15 of the aperture 13. The insert 20 further includes means forming a cylindrical chamber 23 opening onto a rear surface thereof. In a preferred embodiment, cup-shaped insert 20 further includes a projecting, peripheral side wall 25 which has pressure receiving front wall 21 formed thereon, the junction between the peripheral side wall 25 and the front wall 21 forming a tapered seating surface 27 such that, when socket 20 is inserted into aperture 13 of front member 12, the exterior surface 21a of pressure receiving front wall 21 positively seats flush with the front surface of front member 12 in the manner depicted in FIG. 1.

Electronics for switch assembly 10 are mounted on a circuit board 41 disposed within the interior space between front member 12, side walls 16 and back plate 18. The switch assembly 10 is electrically connected via plural electrical connectors 31, 33, 35 and 37. Referring to the interior end view of front panel 12 of FIG. 3, circuit board 41 is secured at its front end by insertion into slots 45 of front panel 12. Circuit board 41 is secured at its read end via electrical connectors 31, 33, 35 and 37 which protrude through corresponding holes in back panel 18. Circuit board 41 includes light emitting diode 151 disposed at the near end. Light emitting diode 151 is disposed to be visible through opening 14 in front panel 12. In addition, one or more lamps 43 are disposed at the near end of circuit board 41 near socket 20. Other electronic circuits of switch assembly 10 will be more fully described below in conjunction with FIGS. 7 to 12.

Figures 4, 5A:
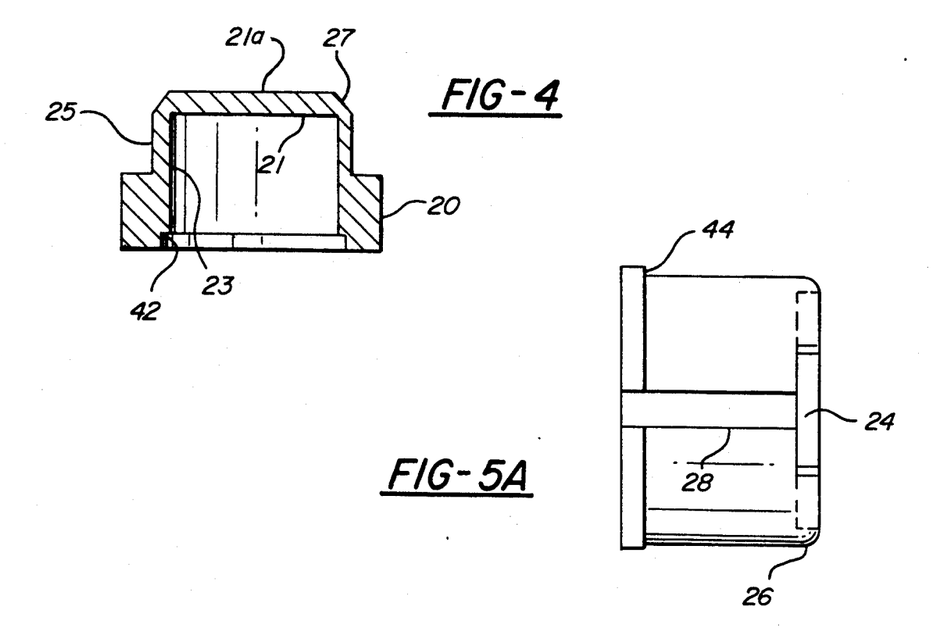
FIG. 4 is a side sectional view of the cup-shaped insert of the switch assembly of FIG. 1.
FIGS. 5A and 5B are, respectively, side and front views of the insert plug of the switch assembly of FIG. 1.
Figure 5B:
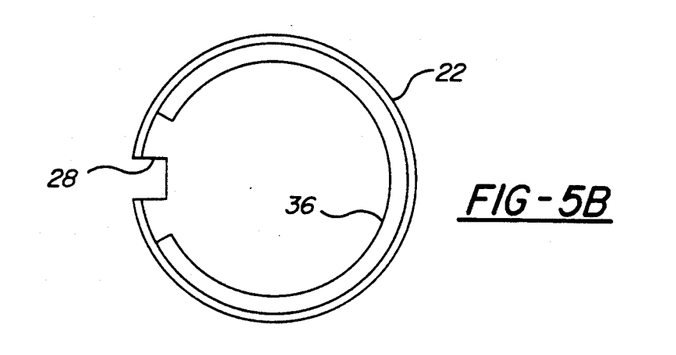

Referring now to FIGS. 5A and 5B, a cylindrical plug 22 is configured to be received in chamber 23. Cylindrical plug 22 has an annular rim 26 formed on a front face thereof to define a hollow recess 24 on the front face of the cylindrical plug 22. Plug 22 further includes an axially extending channel 28 formed on a peripheral surface thereof.

Figure 6:
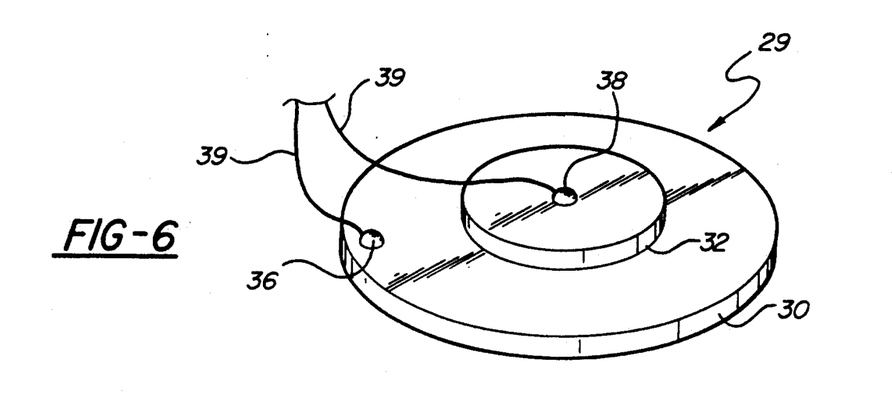
FIG. 6 is a perspective view of the piezoelectric module used in the switch assembly of FIG. 1.

A piezoelectric module 29, which is best seen in FIG. 6, is disposed between the socket 20 and plug 22. Piezoelectric module 29, which is a commercially available unit, includes a carrier disk 30 formed of a deformable, electrically conductive substance. Preferably, carrier disk 30 will be formed of a metallic substance such as brass. Carrier disk 30 is peripherally supported by annular rim 26. A substantially planar wafer 32 of piezoelectric material is mounted approximately coaxially on the carrier disk 30, and overlays and projects into the hollow recess 26. A first electrode 36 is mounted on the piezoelectric wafer 32 and a second electrode 38 is mounted on carrier disk 30. A pair of electrical leads 39 are in electrical communication with the first and second electrodes 36,38 and extend through axial channel 28 formed in plug 22. First and second electrodes 36,38 may be comprised of solder joints formed when leads 39 are attached to, respectively, piezoelectric wafer 32 and brass carrier 29.

A compressible disk 34 is configured to be received in hollow recess 24 between plug 22 and piezoelectric module 29. The purpose of compressible disk 34, which, preferably, is formed of a polymeric foam, is to maintain piezoelectric module 29 in its correct position, with carrier disk 30 being supported on its periphery on the rim 26 of plug 22, and piezoelectric wafer 32, which compresses portions of compressible disk 34, extending into recess 24. Because compressible disk 34 is resilient, slight deformation of piezoelectric wafer 29 caused by pressure on pressure receiving front wall 21 will cause deformation of piezoelectric wafer 32, while the carrier disk 30 remains peripherally supported on rim 26. By means of such an arrangement, the elements comprising switch assembly 10 remain in correct alignment.

The switch assembly 10 includes electronic circuit mounted on circuit board 41 in a conventional manner. This electronic circuit, depicted schematically in FIGS. 7 to 12, is in electrical communication with leads 39 and operative to perform a predetermined switch function upon receipt of an electrical signal generated by piezoelectric wafer 32.

The electronic circuit must recognize the pressure signature of a human finger while remaining relatively insensitive to several noise generators. These noise generators include impact shock, vibration, electrostatic discharge, thermal shock and mechanical stress. Impact shock results if the switch housing or mounting receive a sudden, short mechanical stress. This could result if something were dropped on the switch assembly or its mounting. Piezoelectric modules of this type are generally quite sensitive to high frequency mechanical shock and often generate very high electrical signals in response. Vibration is similar to impact shock except it is generally repetitive or continuous and of lesser intensity. Electrostatic shock causes a noise signal similar to impact shock when an electrostatic discharge occurs upon the switch assembly or its immediate surroundings. Thermal shock results from a sudden change of temperature on the switch assembly. This could occur, for example, if cold water were splashed on the switch assembly. The piezoelectric module generates electrical signals due to both the mechanical stress in the immediate surroundings from thermal expansion/contraction and due to an inherent pyroelectric effect. Most piezoelectric modules exhibit a pyroelectric effect in generation of electrical signals in response to changes in temperature. Mechanical stress can result from stress on the switch assembly mounting, warping of overlays, etc. and commonly comes from thermal stress.

Figure 7:
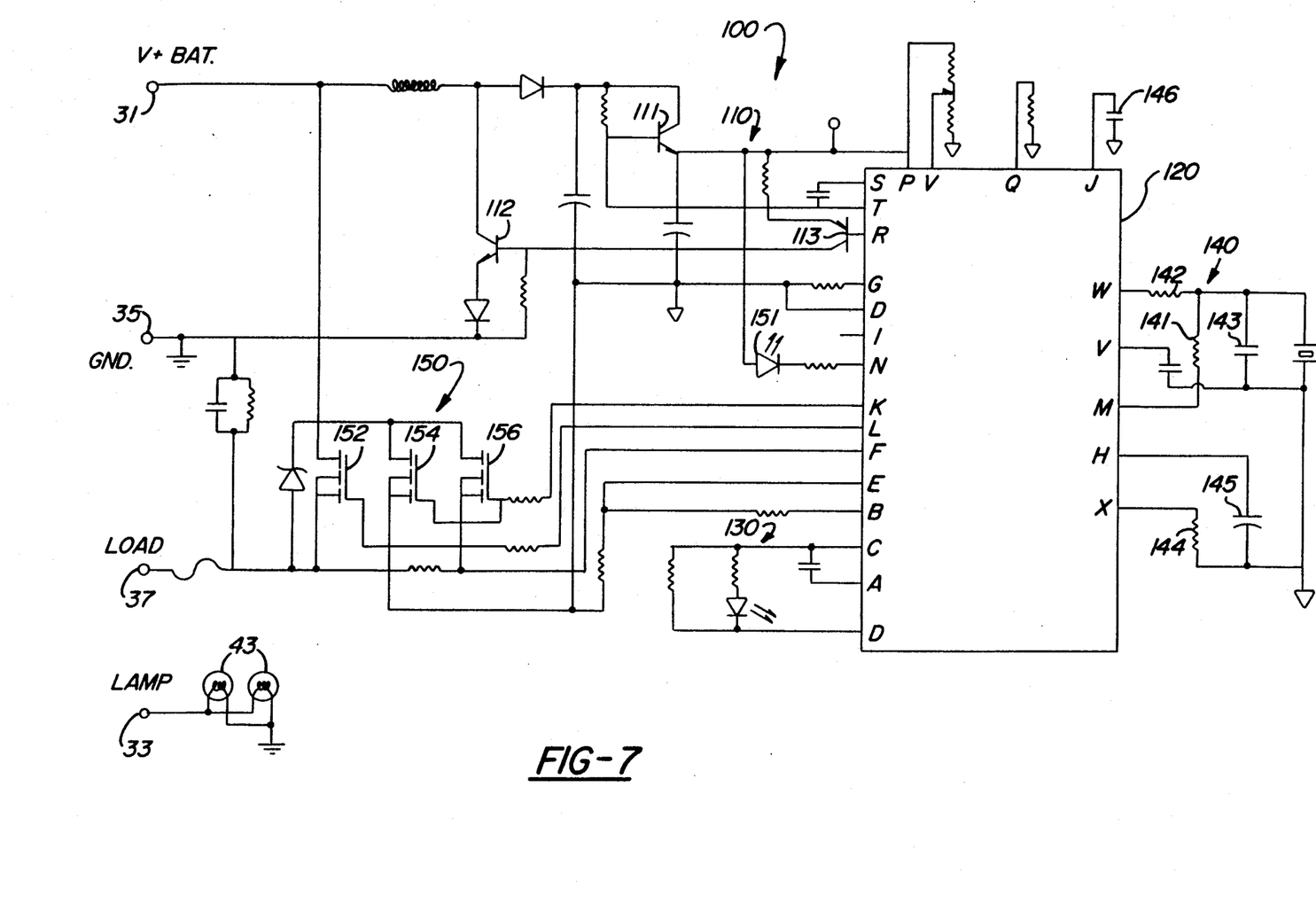
FIG. 7 is a schematic diagram of a circuit arrangement of switching circuitry suitable for use with the switch assembly of FIG. 1, the circuitry providing a plurality of selectable switching functions to be effected upon actuation of the switch assembly.

Circuit 100 depicted in FIG. 7 includes: a power supply section 110; a special purpose integrated circuit 120; an integrator section 130; a piezoelectric sensor front end section 140; and an output section 150 which includes a light emitting diode indicator 151 and field effect power switching transistors 152 and 154.

Circuit 100 is capable of operating in three switch modes: a TOGGLE mode, wherein the switch assembly 10 may be toggled on and off; an OFF/DIM/ON mode wherein the switch assembly 10 may be switched from an off state to a state supplying partial power to the load such as to dim an electric light (not depicted) to a fully on state; and a MOMENTARY mode wherein the load remains powered only as long as pressure is maintained on pressure receiving front wall 21. The voltage connected to a select input at pin I of integrated circuit 100 provides the multiple switching modes. For the toggle mode, the supply voltage $V_{cc}$ is selectively connected to the select input of integrated circuit 100. In the OFF/DIM/ON mode, the select input is connected to a voltage between the supply voltages $V_{cc}$ and $V_{ss}$. A reference voltage is available at pin M which is within this range and the OFF/DIM/ON mode is preferably selected by connecting pins I and M. For the momentary mode, the select input is connected to the supply voltage $V_{ss}$. The operation of switch assembly 10 in each of these modes with be further described below.

Figure 8:
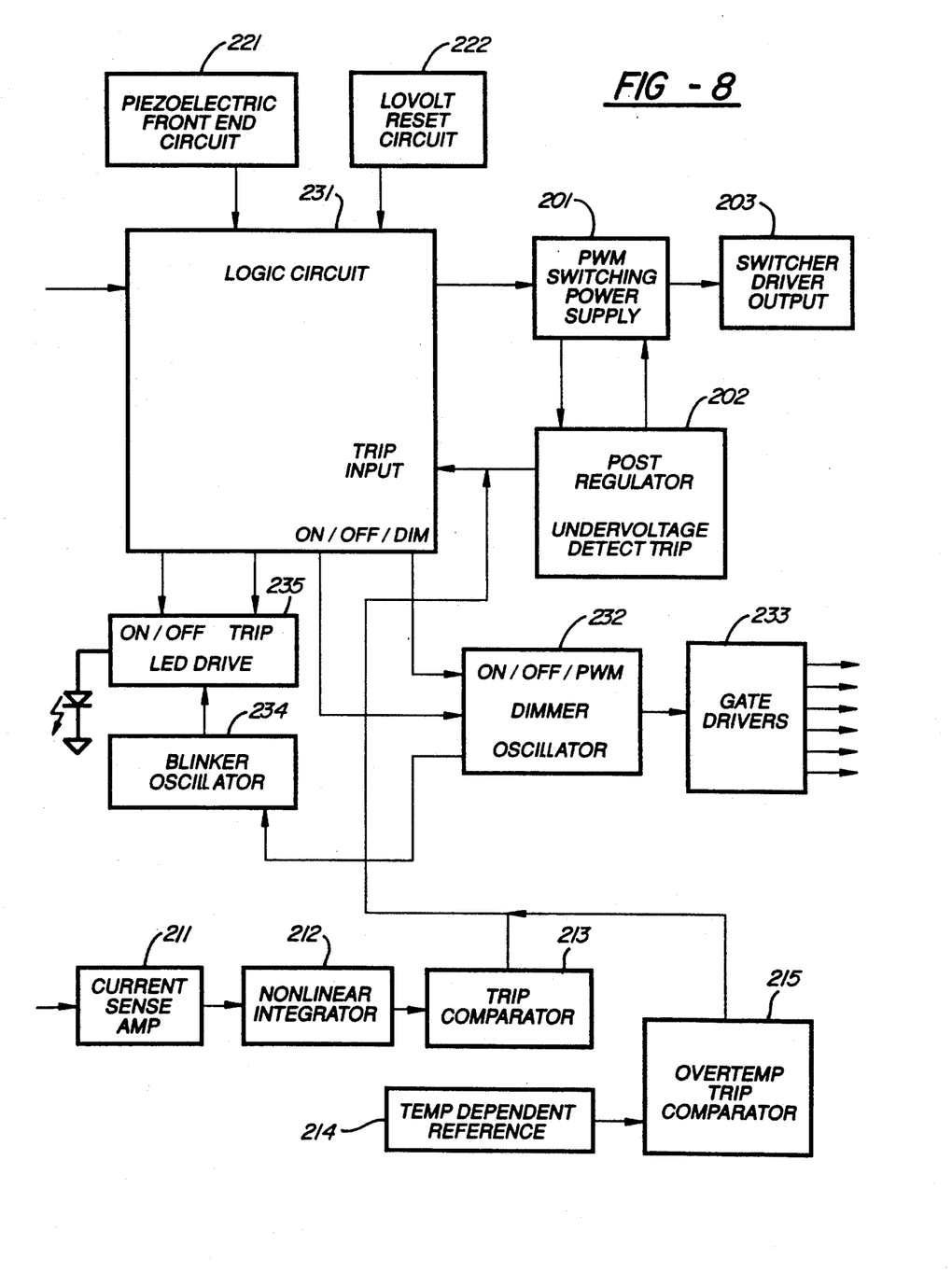
FIG. 8 illustrates in block diagram form the construction of the special purpose integrated circuit illustrated in FIG. 7.

FIG. 8 illustrates in block diagram form the circuits included within integrated circuit 120 illustrated in FIG. 7. This integrated circuit 120 includes: a switching power supply section including pulse width modulated switching power supply 201, post regulator and undervoltage trip circuit 202 and switcher driver output 203; current sense amplifier 211; nonlinear integrator 212; overcurrent trip circuit 213; temperature reference circuit 214; overtemperature trip circuit 215; piezoelectric front end circuit 221; low voltage reset circuit 221; logic circuit 231; OFF/DIM/ON pulse width modulation oscillator 232; gate driver circuit 233; blinker oscillator 234; and light emitting diode driver circuit 235.

Figure 9:
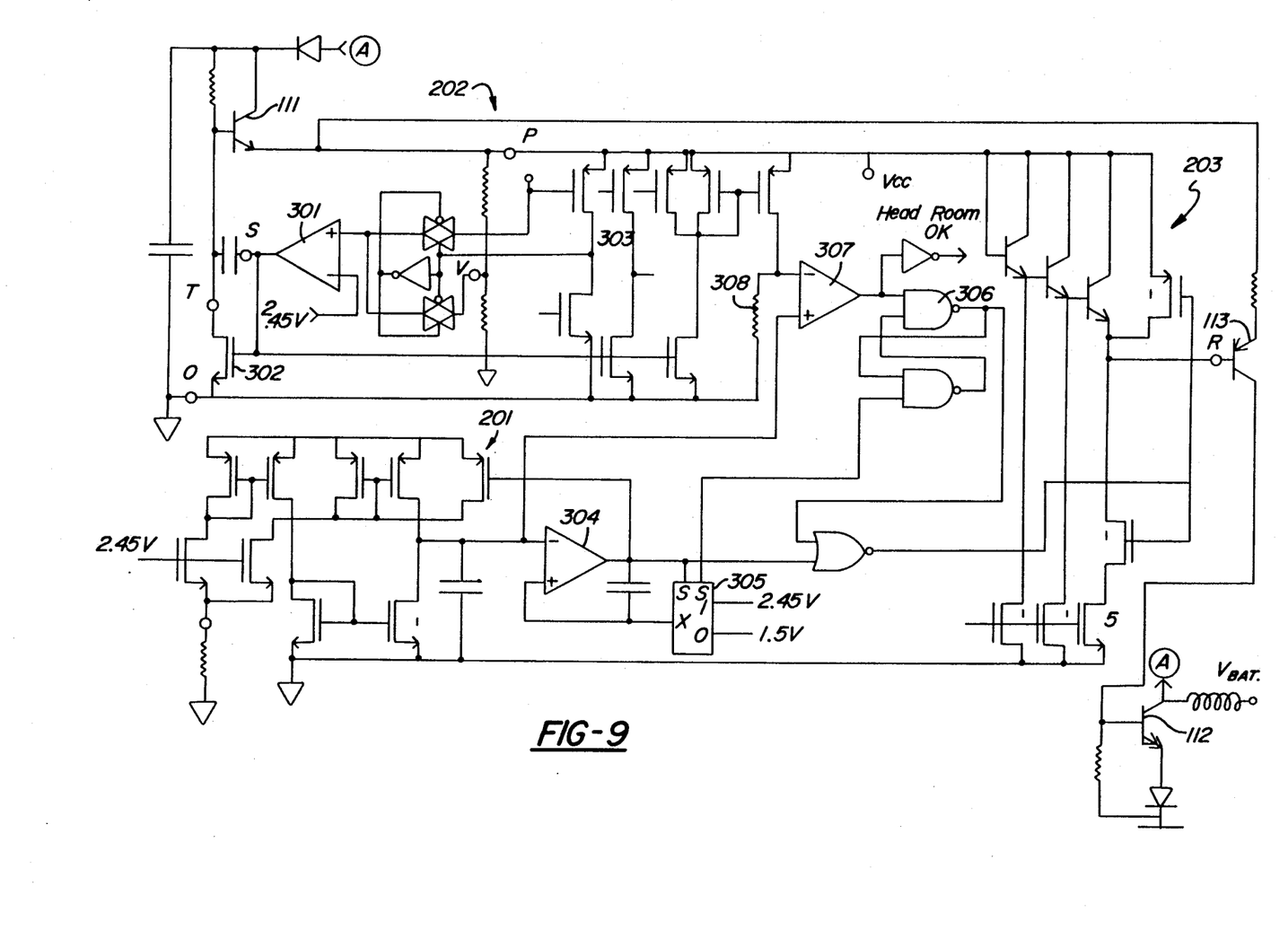
FIG. 9 is a schematic diagram of the power supply portion of the special purpose integrated circuit illustrated in FIG. 7.

A regulated power supply consisting of pulse width modulated switching power supply 201, post regulator and undervoltage trip circuit 202 and switcher driver output 203 together with some of the components of power supply section 110 (see FIG. 7) external to integrated circuit 120 are illustrated in FIG. 9. This regulated power supply is required to safely limit the voltage into integrated circuit 120 and to regulate the supply voltage to 10 volts. There is a voltage adjust input at pin U that if tied to $V_{cc}$ will default to the internally set 10 volt level but if connected to an external resistive divider will set the voltage anywhere from $V_{bndgap}+V_{th}$ (~3.5 volts) and up. The bandgap reference $V_{bndgap}$ is produced by the piezoelectric front end circuit 221 and used as the voltage reference for comparator 301. Note that $V_{th}$ is the field effect transistor threshold voltage. Comparator 301 drives a field effect transistor 302 having an open drain output at pin T that pulls down the base resistor of the external pass transistor 111. The pass transistor 111 is a darlington with minimum beta of 3000. Input voltage spikes on the collector side of the pass transistor 111 will be on the order of 50 volts. With a 100 kilo-ohm bias resistor the open drain output will need to sink at least 0.5 mA to maintain regulation. It is planned to bypass the output of the pas transistor 111 to the circuit floating ground with a capacitor of about 10 $\mu f$.

The load on the pass transistor 111 is not expected to exceed 10 mA. The worst case load condition is when the TRIP indicator light emitting diode 151 is blinking (3 Hz). Trip indicator light emitting diode 151 is a high efficiency type and will be biased around 2 to 5 mA.

The post regulator 202 output drive is also used via a current mirror 303 to generate an undervoltage trip output should be headroom of the pass transistor 111 ever get too small. This undervoltage trip signal is used by logic circuit 231 to shut down operation.

Pulse width modulated switching power supply 201 and switching driver circuit 203 have a boost topology. The output drive from these circuits is level translated from the floating voltage levels of integrated circuit 120 down to the switching transistor 112 via an external transistor 113. The pulse width modulated switching power supply 201 is based on an oscillator that produces an asymmetric triangle wave with a rising ramp 3 times faster than the falling ramp. This oscillator uses a 4:1 ratio switching current source into an internal capacitor. A comparator 304 has its thresholds set by a 2:1 analog multiplexer 305 so the oscillator runs between 1.5 volts and 2.45 volts (the bandgap voltage $V_{bndgap}$). The oscillator needs to run unaffected by supply voltage down to a $V_{dd}$ of 4 volts. A 75% duty square wave out goes into an RS latch 306. The outer side of RS latch 306 is driven by a comparator 307 that reduces the duty cycle if the drive out of the post regulator exceeds a certain level. Comparator 307 also sets the voltage headroom for the post regulator. A fixed current source is subtracted from a current mirror and the result is fed to a resistor 308 that generates the comparison voltage. This is compared to the pulse width modulator oscillator ramp. If the comparator 307 goes low then RS 306 latch is toggled and the ON state of the switcher output is disabled until the next cycle. If the comparison voltage is high enough the switcher duty cycle is reduced to 0% (Off).

The output of the switcher is clamped at 1.5 volts below $V_{dd}$ by transistor clamps. The output needs to drive about 50 μA into the base of the level shift transistor 113.

The output of a headroom comparator 307 is also used to enable logic circuit 231 by indicating that a proper working supply voltage has been attained and that the integrated circuit is stabilized. Logic circuit 231 cannot produce a drive to power field effect transistors 152, 154 and 156 without this headroom OK signal.

Figure 10:
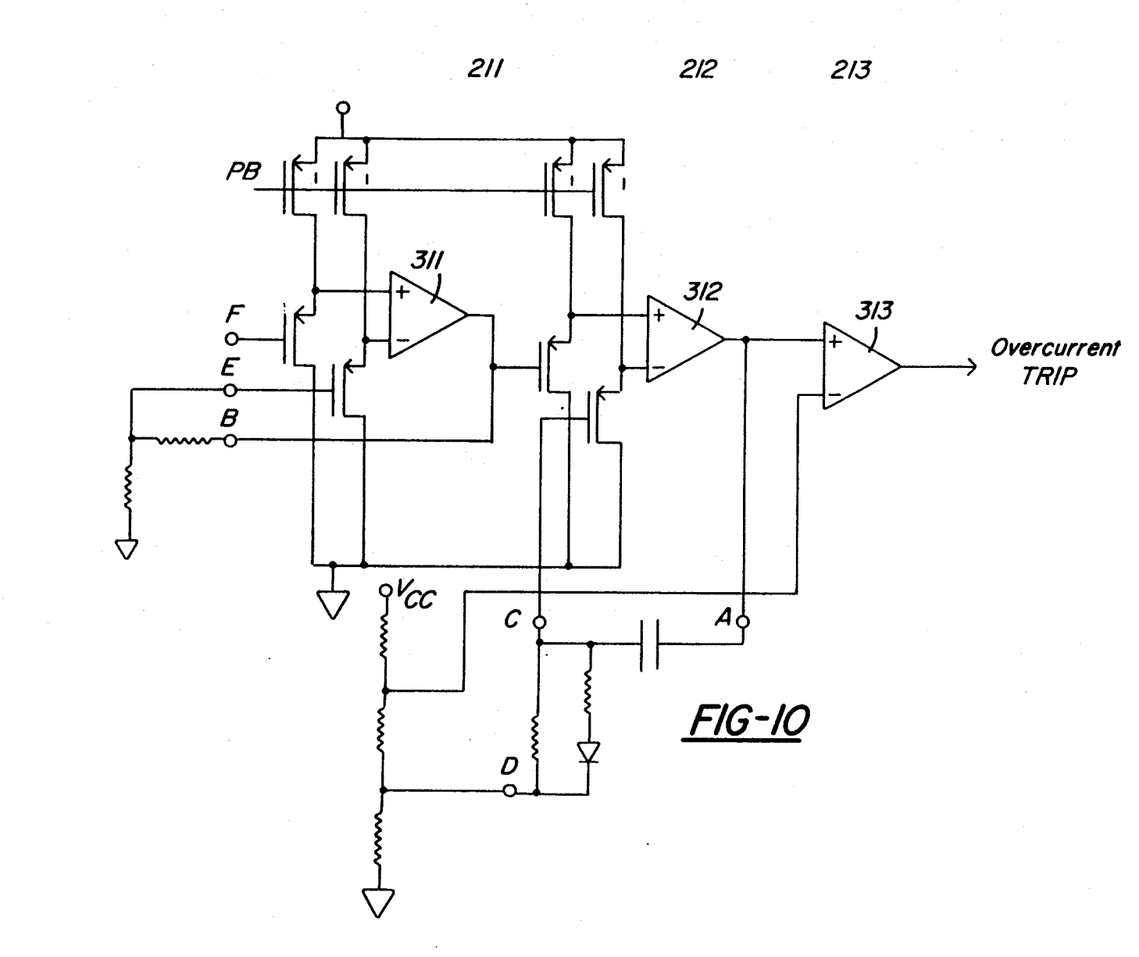
FIG. 10 is a schematic diagram of the overcurrent detector portion of the special purpose integrated circuit illustrated in FIG. 7.

Current sense amplifier 211, nonlinear integrator 212 and overcurrent trip circuit 213 illustrated in FIG. 10 provide additional circuit and load protection. Current sense amplifier 211 is simply an operational amplifier 311 with 0 volt common mode range that is configured (externally) as a noninverting amplifier with gain of approximately 6. The input to operational amplifier 311 comes from a current sensing resistor connected between the sources of field effect switching transistors 154 and 156. The normal active signal input range is 0 to 2.5 volts. Although the noninverting input can swing to as high as $V_{dd}$, as long as the output of the operational amplifier stays above $V_{dd}-2$ volts during this condition there are no problems. The output of this operational amplifier drives a resistive load on the order of 50 KΩ. The input offset voltage of this operational amplifier should be less than 10% of the 60 mV threshold signal. An input offset voltage of 3 mV is good.

Nonlinear integrator 211 consists of an identical operational amplifier 312 that is configured as a noninverting integrator. The noninverting input is tied to the output of the first operational amplifier 311 via a voltage follower. The input voltage swing will be rail to rail, and operational amplifier 312 should be linear from 0 volts to $V_{dd}-2$ volts, above $V_{dd}-2$ volts the output should remain above $V_{dd}-2$ volts. The output is driving a 0.1 μF external capacitor into a resistance of approximately 100 kilo-ohm rail to rail.

Both these operational amplifiers 311 and 312 need to have a common mode range that includes ground and a positive slew rate of 2 to 5 volts/μsec. The output drives must be able to source at least 200 μA.

Overcurrent trip circuit 213 that follows nonlinear integrator 212 is comparator 313. The characteristics of this comparator 313 are not critical. In fact, it could be simply a P-type field effect transistor with its gate tied to reference voltage and source driven by the output of nonlinear integrator 212. It needs to have a fast positive output edge. The total response time of this circuit to an input step should be less than 5 μsec but not less than 1 μsec to avoid false responses to glitches generated during the turn on of power field effect transistors 154 and 156.

Figure 11:
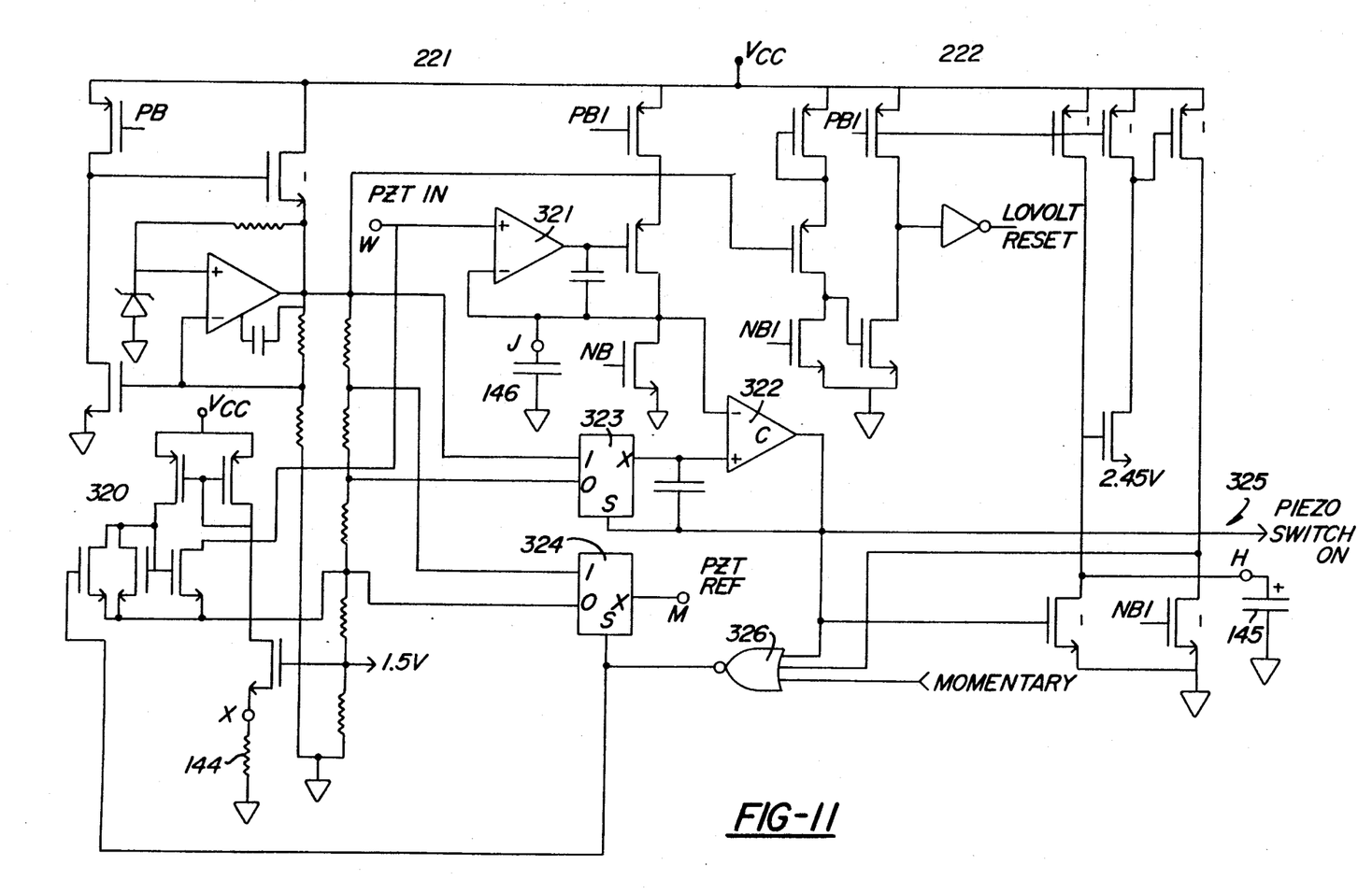
FIG. 11 is a schematic diagram of the piezoelectric front end portion of the special purpose integrated circuit illustrated in FIG. 7.

Piezoelectric front end circuit 221 and low voltage reset circuit 222 are illustrated in FIG. 11. Piezoelectric front end circuit 221 generates a bandgap reference voltage $V_{bndgap}$ used to set the regulator voltage and as a supply independent voltage and current reference. It is also used as the temperature sensor for the overtemperature comparator. Integrated circuit 120 should operate down to 4 volts $V_{dd}$ therefore a ground referenced bandgap with 2.45 volt output was chosen. The voltage out is not that critical, other similar values could be used. This bandgap reference voltage is supplied externally of special purpose integrated circuit 120 via pin M.

A low voltage reset signal is generated by low voltage reset circuit 222 if $V_{dd}$ is less than approximately 1.5 volts above $V_{bndgap}$.

The switch assembly 10 must be able to deal with a very large range of output from piezoelectric module 29. This voltage ranges from a low of about 0.7 volts needed to trigger the switch operation to several hundred volts generated under impact shock. The piezoelectric front end circuitry must not only tolerate this range of output voltages but must also operate consistently without producing false results. Piezoelectric sensor front end section 140 and piezoelectric front end circuit 221 cooperate to provide noise immunity and consistent operation. The maximum current into integrated circuit 120 is limited by resistor 142. Resistor 142 is included primarily to protect integrated circuit 120 from large voltages generated by piezoelectric module 29.

Piezoelectric sensor front end section 140 includes piezoelectric module 29. The negative terminal of piezoelectric module 29 is connected to ground. The positive terminal of piezoelectric module 29 is pulled up to a reference voltage via two conduction paths. First, this terminal of piezoelectric module 29 is connected to the piezoelectric reference voltage (PZT REF) at pin M via resistor 141. Resistor 141 has a high value of within the range of from 1 to 100 MΩ and preferably within the range from 5 to 20 MΩ. Second, this terminal of the piezoelectric module is connected to a negative current source 320 inside special purpose integrated circuit 120 via pin W and resistor 142. Note that the strength of this current source is set by external resistor 144 connected to pin X. Negative current source 320 pulls down the voltage at pin M to the value of the piezoelectric reference voltage. These small current paths suppress slow drifting of the response of piezoelectric module 29 due to thermal or mechanical stress while not significantly attenuating the more rapid change in voltage when pressure receiving front wall 21 is depressed.

Capacitor 143 is connected across piezoelectric module 29. Capacitor 143 has a capacitance of from 3 to 4 times the capacitance of piezoelectric module 29. This serves to damp the voltage swings observed across piezoelectric module 29 by a factor of 3 to 4. This has the result of requiring firmer pressure on pressure receiving wall 21 to obtain a given output voltage. This also reduces the response to noise, leakage and finger jitter, thereby providing a larger margin between the signal and these noise generators.

Piezoelectric front end circuit 221 includes a high impedance input buffer amplifier 321 having an input connected to piezoelectric module 29 at pin W. The circuits of special purpose integrated circuit 120 are protected from large voltage swings at piezoelectric module 29 by resistor 142. Resistor 142 preferably has a large resistance on the order of several MΩ. Piezoelectric front end circuit 121 may also include voltage clamps. Thus the circuit is protected from large voltage appearing at piezoelectric module 29, such as due to impact shock or electrostatic discharge.

Buffer amplifier 321 is slew rate limited. The maximum slew rate is set by capacitor 146 which is connected to its output via pin J. Thus the maximum rate of change of output of buffer amplifier 321 is limited no matter how fast the input received from piezoelectric module 29 changes. This slew rate is the same in the positive going direction and the negative going direction. The slew rate is preferably set to mask any input signal having a duration less than 30 to 50 milliseconds. This is possible because buffer amplifier 321 cannot respond to such short signals. This also serves to filter out any AC signals appearing across piezoelectric module 29, such as due to vibration or electromagnetic interference, with more than a predetermined frequency set by the maximum slew rate. This does not add any DC bias which would interfere with pressure detection.

The output of buffer amplifier 321 goes into a comparator 322 with hysteresis set by an analog multiplexer 323 that is controlled by the output of comparator 322. The multiplexer 323 selects one of two voltages from a resistor divider. A higher voltage of about 0.7 volts above the reference potential (2.5 volts above ground) is initially selected. The lower voltage of about 0.5 volts above the reference potential (2.3 volts above ground) is selected when comparator 322 trips. Comparator 322 remains tripped until the voltage from the buffer amplifier 321 falls below the lower threshold. The higher comparison voltage is again selected when the capacitor discharges. The hysteresis action of comparator 322 together with the slew rate limitation of buffer amplifier 321 make switch assembly 10 relatively insensitive to switch bouncing due to noisy inputs. The output of comparator 322 is a piezo "Switch On" signal which is used by the logic circuit 231 in the switching function.

Both the slew limited buffer amplifier 321 and the comparator 322 are dealing with signals that are 0.7 volts below the bandgap voltage to $V_{dd}$. As long as these devices are well behaved at voltages above $V_{bndgap}$ they only really have to work up to $V_{bndgap}$ in the linear region.

The prior discussion is relevant to each of the three modes of operation. The MOMENTARY mode requires additional considerations and circuits. Finger pressure on pressure receiving front wall 21 causes piezoelectric module 29 to generate a voltage corresponding to the stress. This voltage generally exceeds the initial threshold voltage of comparator 322. However, the amount of signal generated is very small and even small leakage currents cause the voltage to rapidly decay to below the lower second threshold of comparator 322 even if the pressure continues. Comparator 322 would ordinarily reset in the absence of removal of the pressure. This would prevent the implementation of a momentary contact mode as proposed.

Piezoelectric front end circuit 221 includes two features which enable a momentary contact mode. The PZT REF signal available at pin M is generated by the same resistive divider that generates the thresholds for comparator 322. This PZT REF signal can be 1 of 2 values as selected via analog multiplexer 324. Under all conditions except for MOMENTARY mode the PZT REF signal is a first value called the resting voltage (about 1.8 volts above ground). If switch assembly 10 is in MOMENTARY mode and comparator 322 indicates that pressure receiving front wall 21 is depressed, then the PZT REF signal is switched to 0.6 volts above the resting voltage (2.2 volts above ground). This is 0.1 volts above the enabled lower threshold of comparator 322. Note that in this state NAND gate 326 disables current source 320. Thus the piezoelectric module input at pin W is pulled to the new PZT REF signal level which insures that comparator 322 is tripped. This change in the PZT REF signal keeps comparator 322 tripped while finger pressure continues on pressure receiving front wall 21. Removal of the pressure from pressure receiving front wall 21 causes a negative signal from piezoelectric module 29 sufficient to reset comparator 322. At that time the threshold of comparator 322 is returns to the initial higher voltage, the PZT REF signal returns to the resting voltage and current source 320 is no longer disabled. Thus the piezo switch on signal is active during the interval that pressure is exerted on pressure receiving front wall 21.

An additional circuit is provided to prevent the piezo switch on signal from hanging up. It is possible for the user to release the pressure on pressure receiving front wall 21 so slowly that the negative going signal generated on release is never sufficient to reset comparator 322. If this occurs, then the switch would be stuck on in the MOMENTARY mode even after removal of the pressure. Timeout circuit 325 prevents this possibility. Timeout circuit 325 is enabled whenever comparator 322 indicates pressure receiving front wall 21 is pressed. Timeout circuit 325 starts charging up external capacitor 145 via pin H with a current source. When the capacitor voltage exceeds a threshold, the PZT REF signal is restored to its resting state via NAND gate 326. This technique ensures that the switch is reset. Thus the piezo switch output remains high until the pressure is released from pressure receiving front wall 21 or the timeout occurs, which ever comes first.

Figure 12:
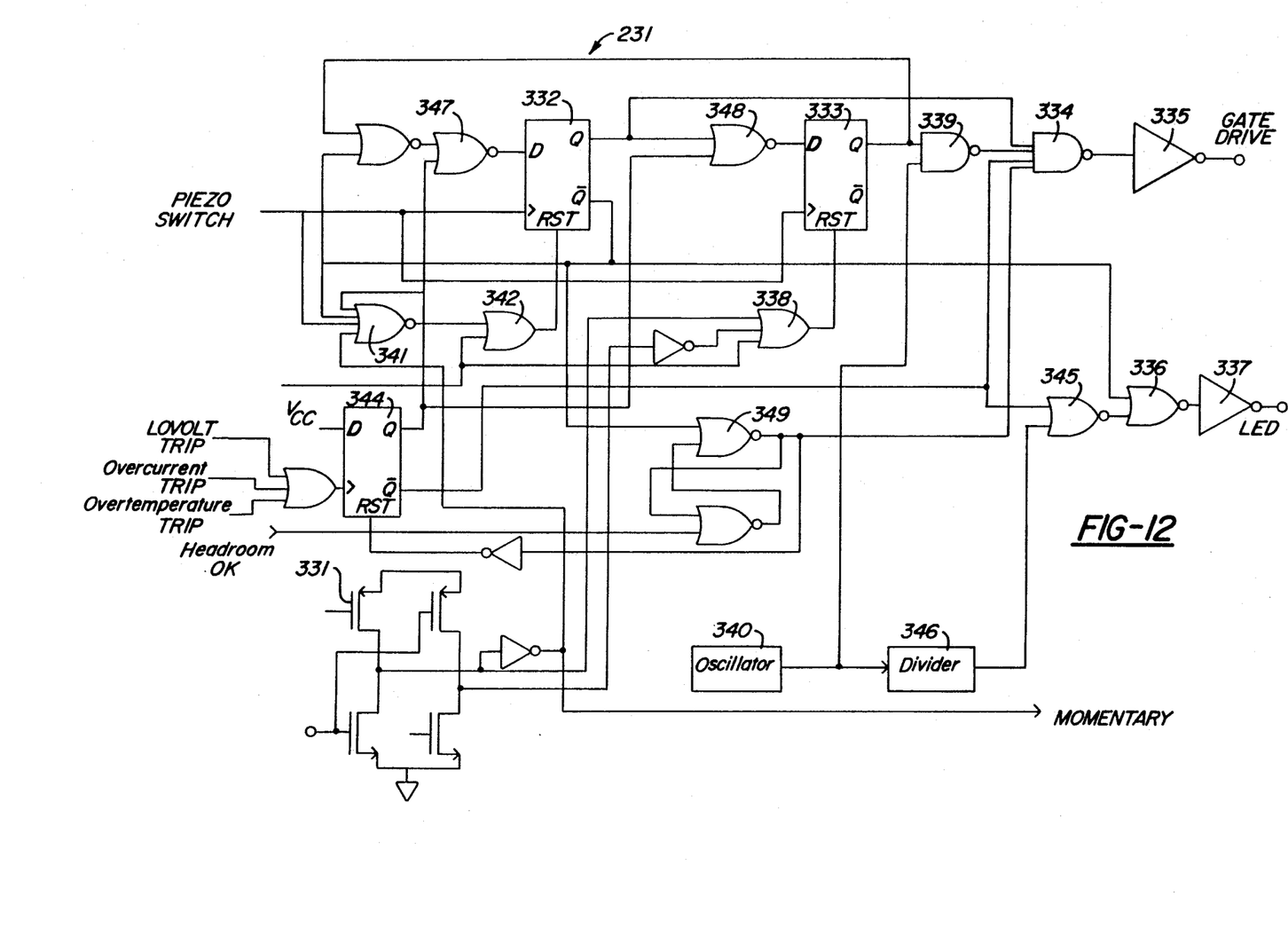
FIG. 12 ia a schematic diagram of the logic circuit portion of the special purpose integrated circuit illustrated in FIG. 7.

FIG. 12 illustrates logic circuit 231, OFF/DIM/ON pulse width modulation oscillator 232, and blinker oscillator 234. Logic circuit 231 handles the different sequences of states that can be selected via the select pin I. The three modes of operation are TOGGLE, OFF-/DIM/ON, and MOMENTARY. If the select input is connected to $V_{dd}$ the TOGGLE mode is selected. If the select input is between $V_{dd}$ and ground the OFF/DIM-/ON mode is selected. This is preferably achieved by connection of pins I and M. Lastly, if the select input is grounded the MOMENTARY mode is selected. A voltage comparator 331 detects the voltage level applied to the select input and produces signals for control of the current supplied to the load. Voltage comparator 331 also produces the MOMENTARY signal used by piezoelectric front end circuit 221.

Logic circuit 231 includes a pair of flip-flops 332 and 333 which retain the state selected by the mode and depression of pressure receiving front wall 21. When in the TOGGLE mode only flip-flop 332 is active. Each depression of pressure receiving front wall 21 toggles flip-flop 332, which changes the output via NAND gate 334. Invertor 335 drives the gate driver circuits (not shown). At the same time the NOT Q output of flip-flop 332 causes light emitting diode 151 to be illuminated via NOR gate 336 and invertor 337. The OR gate 338 keeps flip-flop 333 reset when in either the TOGGLE or the OFF/DIM/ON modes.

During the OFF/DIM/ON mode both flip-flops 332 and 333 are active. These two flip-flops are connected in a three state counter. Each depression of pressure receiving front wall 21 advances this counter one state. When in the DIM state, the Q output from flip-flop 333 enables NAND gate 339 to pass the signal from oscillator 340. Oscillator 340 is a square wave oscillator operating at a 40% to 50% duty cycle at about 100 Hz. This drives the gates at the 40% to 50% duty cycle causing a reduced average power to be supplied to the load, such as to dim an electric lamp.

Only flip-flop 332 is active when in the MOMENTARY mode. Initial depression of pressure receiving front wall 21 toggles flip-flop 332 to turn ON the load. Release of the pressure causes NOR gate 341 to reset flip-flop 332 via OR gate 342. Thus switch assembly 10 supplies power to the load only during the time pressure receiving front wall 21 is pressed.

Logic circuit 221 includes a number of safety features. If during DIM or ON states any of the trip inputs (overcurrent, undervoltage, or overtemperature) goes high OR gate 343 toggles flip-flop 344. The NOT Q output of flip-flop 344 removes gate drive via NAND gate 334. This NOT Q output also blinks the light emitting diode 151 by permitting NOR gate 345 to pass the oscillating signal from divider circuit 346 to the driver circuit. Divider circuit 346 includes 5 stages to divide by 32 the signal from oscillator 340. Thus light emitting diode 151 blinks at a rate of about 3.125 Hz. At the same time the connection between flip-flops 332 and 333 is blocked by NOR gates 347 and 348. Logic circuit 221 remains in this trip state for a switch input to clear the trip state. If at any time the LOVOLT RESET goes high both flip-flops 332 and 333 are reset to the OFF state via OR gates 342 and 338, respectively. When changing from the OFF state to the DIM or ON state, gate drive is disabled at NAND gate 334 via RS latch 349 until a sufficient field effect transistor gate drive voltage is available.

Typically, the switch insert 20 and insert plug 22 are formed of a clear polymeric material such as clear polycarbonate. Typically, front cover 12 will be formed of an opaque material. An indicia-bearing surface 40 may be provided which is disposed on a rear surface of pressure receiving front wall 21. Preferably, indicia-bearing surface 40 is comprised of a thin, resilient material such as a 10-mil film of white polystyrene with colored or black indicia imprinted thereon. Because socket 20 is formed of clear polycarbonate, indicia-bearing surface 40 will be visible through front wall 21 to the operator of switch assembly 10. Lamp 43 provides backlight through socket 20.

Switch assembly 10, constructed as explained above, possesses certain advantages over the prior art. Purchase components, such as piezoelectric module 29, are used. The purchased piezoelectric modules require no additional shaping or machining. The piezoelectric wafers themselves do not need to fit closely within hollow recess 24. The design allows for size variations. The switch will operate correctly as long as carrier disk 30 remains peripherally supported on rim 26. Any looseness of fit is compensated for by compressible disk 34. Furthermore, the pressure receiving front wall 21 of switch assembly 10 is flush with the front member 12 and, thus, is ideal in situations where a flush switch is desired. For example, the switch of the present invention may be inserted into an article such as a vending machine so that its pressure receiving front wall is flush with the front of the vending machine. Thus, the machine presents a sleek, modern appearance. Furthermore, the interior switch components and delicate piezoelectric material are sealed from the ambient environment since they are encased in clear polymeric material. Thus, the switch of the present invention is especially desirable for applications where a harsh environment is encountered, whether due to humidity, temperature or acts of attempted vandalism.

Assembly of the switch of the present invention is particularly quick and easy. Once the individual components have been provided, resilient disk 34 is inserted into hollow recess 24. Piezoelectric module 29 is then inserted into hollow recess 24 atop foam disk 34 such that piezoelectric wafer 32 projects into hollow recess 24 and carrier disk 30 is peripherally supported by rim 26 of plug 22. Electrical leads 39 are then drawn through channel 28 so that their ends project therefrom. Plug 22 is then inserted into the hollow chamber 23 of switch insert 20. So that plug 22 will positively seat in correct position within hollow chamber 23, an annular groove 42 may be formed on a rear edge of cylindrical cavity 23. A mating annular ring 44 may be formed on a rear face of plug 22 such that, when the plug 22 is inserted into cylindrical cavity 23, mating annular ring 44 seats positively in groove 42, thereby correctly positioning the plug inside the socket.

Figure 3:
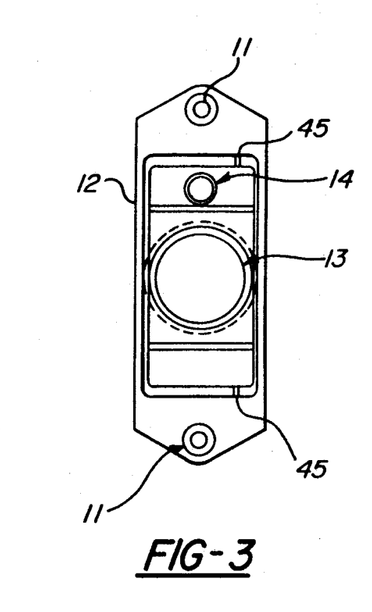
FIG. 3 is an end view of the front member of the switch assembly shown in FIG. 1.

Socket 20 is inserted into aperture 13 of front member 12 such that tapered seating surface 27 of insert 20 seats positively against tapered annular lip 15, thus bringing the exterior surface 21a of pressure receiving front wall flush 21 with the front surface of front member 12. Electrical leads 39 may then be connected to electronic circuit depicted in FIG. 7. The near end of circuit board 41 is then inserted into slots 45 in front panel 12. Next the body including sides 16 is slipped over circuit board 41 and mated with front panel 12. Lastly, back panel 18 is installed with electrical connectors 31, 33, 35 and 35 protruding through corresponding holes. Switch assembly 10 may then be inserted into a control panel using holes 11. It will be noted that all of the assembly steps require no special fitting or machining and may be performed by assemblers having no special training.

The piezoelectric switch assembly of the present invention has been described with, reference to certain embodiments and exemplifications thereof. Doubtless, variations in design may occur to one skilled in the art without departing from the spirit of the present invention. The embodiments and exemplifications described in the present specification are but examples of the practice of the present invention and are not intended to limit the scope thereof. The true scope of the present invention is limited solely by the claims appended hereto.

We claim:

1. A piezoelectric switch assembly comprising:
    a front member mountable on a housing and having means forming a circular aperture defining a peripheral edge;
    a cup-shaped insert having a pressure receiving front wall configured to be received in said aperture such that an exterior surface of said wall is approximately flush with the peripheral edge of the aperture, said insert further including means forming a cylindrical chamber opening onto a rear surface thereof;
    a cylindrical plug configured to be received in said chamber and having an annular rim formed on a front face thereof to define a hollow recess on said front face, said plug further including an axially extending channel formed on a peripheral surface thereof;
    a piezoelectric module disposed between said insert and said plug, said module comprising:
    a carrier disk formed of a deformable, electrically conductive substance, said carrier disk being peripherally supported by said rim, a substantially planar wafer of piezoelectric material mounted on said carrier disk and overlying and projecting into said hollow recess, a first electrode mounted on said wafer, a second electrode mounted on said carrier disk, and first and second electrical leads in electrical communication with, respectively, said first and second electrodes and extending through said channel;

a compressible disk configured to be received in said hollow recess between said plug and said piezoelectric module; and electronic circuit in electrical communication with said first and second electrical leads and operative to perform a predetermined switch function upon receipt of an electrical signal generated by said piezoelectric wafer, whereby manual forces imposed on the exterior surface of said pressure receiving wall of said insert are transmitted to said piezoelectric module to cause deflection thereof, causing said piezoelectric wafer to generate an electrical signal which is provided to said electronic circuit through said electrodes and electrical leads to effect the switch function.

2. The switch assembly of claim 1, wherein the aperture formed in the front member is defined by an annular side wall projecting from a front surface of said front member, said side wall including an annular lip which tapers inwardly from said front surface, and said socket further include a projecting, peripheral side wall having said pressure receiving front wall formed thereon, the junction between said peripheral side wall and said front wall forming a tapered seating surface such that, when the socket is inserted into the aperture of the front member, the pressure receiving front wall positively seats flush with the front surface of the front member.

3. The switch assembly of claim 1, wherein the socket further comprises an annular groove formed on a rear edge of said cylindrical chamber, and said plug further comprises a mating annular ring formed on a rear face thereof, such that, when the plug is inserted into the cylindrical chamber of the socket, the mating annular ring seats positively in the groove, thereby correctly positioning the plug inside the socket.

4. The switch assembly of claim 1, wherein the housing further comprises a back plate, and side walls to enclose the switch components.

5. The switch assembly of claim 4, wherein the front member comprises at least one slot disposed in an interior surface thereof, the electronic circuit consists of a plurality of electrical components disposed on a rectangular circuit board, the rectangular circuit board disposed in the housing having one edge thereof inserted into the at least one slot in the front member.

6. The switch assembly of claim 1, wherein the front member comprises an opening therein, the electronic circuit comprises a light disposed proximate to the opening in the front member and means for selectively illuminating the lamp to indicate the current switch function.

7. The switch assembly of claim 1, wherein the carrier disk is formed of brass.

8. The switch assembly of claim 1, wherein the compressible disk is formed of polymeric foam.

9. The switch assembly of claim 1, wherein the insert is formed of a substantially optically transparent material, the insert further comprising an indicia bearing surface disposed in the chamber and adjacent the pressure receiving front wall.

10. The switch assembly of claim 9, further comprising an electric light disposed to illuminate the rear surface of the insert thereby illuminating the indicia bearing surface through the insert.

11. A piezoelectric switch comprising:

a front member having means forming a circular aperture defining a peripheral edge;

a cup-shaped insert having a pressure receiving front wall configured to be received in said aperture such that an exterior surface of said wall is approximately flush with the peripheral edge of the aperture, said insert further including mans forming a cylindrical chamber opening onto a rear surface thereof;

a cylindrical plug configured to be received in said chamber and having an annular rim formed on a front face thereof to define a hollow recess on said front face, said plug further including an axially extending channel formed on a peripheral surface thereof;

a piezoelectric module disposed between said insert and said plug, said module comprising:

a carrier disk formed of a deformable, electrically conductive substance, said carrier disk being peripherally supported by said rim;

a substantially planar wafer of piezoelectric material mounted on said carrier disk and overlying and projecting into said hollow recess;

a first electrode mounted on said wafer;

a second electrode mounted on said carrier disk; and first and second electrical leads in electrical communication with, respectively, said first and second electrodes and extending through said channel; and a compressible disk configured to be received in said hollow recess between said plug and said piezoelectric module;

whereby manual forces imposed on the exterior surface of said pressure receiving wall of said insert are transmitted to said piezoelectric module to cause deflection thereof, causing said wafer of piezoelectric material to generate an electrical signal.

12. The switch assembly of claim 11, wherein the aperture formed in the front member is defined by an annular side wall projecting from a front surface of said front member, said side wall including an annular lip which tapers inwardly from said front surface, said socket further including a projecting, peripheral side wall having said pressure receiving front wall formed thereon, the junction between said peripheral side wall and said front wall forming a tapered seating surface such that, when the socket is inserted into the aperture of the front member, the pressure receiving front wall positively seats flush with the front surface of the front member.

13. The switch assembly of claim 11, wherein the socket further comprises an annular groove formed on a rear edge of said cylindrical chamber, and said plug further comprises a mating annular ring formed on a rear face thereof, such that, when the plug is inserted into the cylindrical chamber of the socket, the mating annular ring seats positively in the groove, thereby correctly positioning the plug inside the socket.

14. A method of constructing a piezoelectric switch assembly comprising the steps of:

providing a front member having means forming a circular aperture including a peripheral edge;

providing a cup-shaped insert having a pressure receiving front wall configured to be received in said aperture such that an exterior surface of said wall is approximately flush with the edge of the aperture, said insert further having means forming a cylindrical chamber opening onto a rear surface thereof;

inserting said insert into said front member such that said front wall is approximately flush with the peripheral edge of the aperture;

providing a piezoelectric module, said piezoelectric module being formed by providing a carrier disk formed of a deformable, electrically conductive material, providing a substantially planar wafer of piezoelectric material having a diameter substantially smaller than the diameter of the carrier disk, and mounting said wafer on said carrier disk, providing a first electrode, mounting said first electrode on said wafer, providing a second electrode, mounting said second electrode on said carrier disk, providing first and second electrical leads, and putting said first and second electrical leads in electrical communication with, respectively, said first and second electrodes;

inserting said piezoelectric module into said cylindrical cavity with the carrier disk thereof proximate an interior surface of said cylindrical cavity;

providing a cylindrical plug configured to be received in said cylindrical chamber and having an annular rim formed on a front face thereof to define a hollow recess on said front face, said plug further having an axially extending channel formed on the periphery thereof;

providing a disk of compressible material configured to be received in said hollow recess;

inserting said compressible disk into said recess adjacent the piezoelectric module;

inserting said cylindrical plug into said cylindrical cavity such that the periphery of the carrier disk is supported by the rim of the cylindrical plug and the disk of piezoelectric material extends into the hollow recess;

drawing the electrical leads through the axially extending channel;

providing electronic circuit operative to perform a predetermined switching function upon receipt of an electrical signal;

placing said first and second electrical leads in electrical communication with said electronic circuit to form a switch subassembly;

providing a housing configured to receive said subassembly; and placing said subassembly in said housing.

15. The method of constructing a piezoelectric switch assembly as claimed in claim 14, wherein: the electronic circuit consists of a plurality of electronic components disposed on a rectangular circuit board, the the step of providing a front member includes providing at least one slot disposed in an interior surface thereof;

the step of providing electronic circuit includes disposing a plurality of electronic components on a rectangular circuit board; and the step of placing said subassembly in said housing includes inserting one edge of rectangular circuit board into the at least one slot in the front member.

* * * * *